United States Patent
Pang et al.

(10) Patent No.: US 9,664,933 B2
(45) Date of Patent: May 30, 2017

(54) PRODUCTION METHOD OF DISPLAY SUBSTRATE, PRODUCTION CONTROL SYSTEM AND PRODUCTION APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Libin Pang, Beijing (CN); Dongki Oh, Beijing (CN); Xuesong Gao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 1 day.

(21) Appl. No.: 14/427,680

(22) PCT Filed: May 28, 2014

(86) PCT No.: PCT/CN2014/078707
§ 371 (c)(1),
(2) Date: Mar. 12, 2015

(87) PCT Pub. No.: WO2015/109711
PCT Pub. Date: Jul. 30, 2015

(65) Prior Publication Data
US 2016/0026015 A1  Jan. 28, 2016

(30) Foreign Application Priority Data
Jan. 27, 2014 (CN) .......................... 2014 1 0041060

(51) Int. Cl.
*B44C 1/22* (2006.01)
*G02F 1/1333* (2006.01)
(Continued)

(52) U.S. Cl.
CPC ............ *G02F 1/1333* (2013.01); *C23C 14/35* (2013.01); *G02F 1/1303* (2013.01);
(Continued)

(58) Field of Classification Search
CPC ....... H01J 2237/334; H01J 2237/32082; H01J 2237/32091; H01J 2237/3244;
(Continued)

(56) References Cited

U.S. PATENT DOCUMENTS 6,043,864 A * 3/2000 Lo ........................ G03F 7/70541
355/53
6,285,763 B1 * 9/2001 Gotoh .................... G06K 1/126
380/201
(Continued)

FOREIGN PATENT DOCUMENTS

CN  102483471 A  5/2012
CN  102576558 A  7/2012
(Continued)

OTHER PUBLICATIONS

First Chinese Office Action Appln. No. 20141004106038; Dated Nov. 2, 2015.
(Continued)

*Primary Examiner* — Lan Vinh
(74) *Attorney, Agent, or Firm* — Ladas & Parry LLP

(57) ABSTRACT

A production method of a display substrate, a production control system and a production apparatus are provided. The production method includes: in a process for producing the display substrate by a plurality of procedures, forming marks for recording procedure progress information on the display substrate.

12 Claims, 1 Drawing Sheet

(51) Int. Cl.
  *H01L 23/544* (2006.01)
  *C23C 14/35* (2006.01)
  *G02F 1/13* (2006.01)

(52) U.S. Cl.
  CPC ............. *H01L 23/544* (2013.01); *G02F 2001/133374* (2013.01); *H01L 2223/54433* (2013.01); *H01L 2223/54486* (2013.01); *H01L 2924/0002* (2013.01)

(58) Field of Classification Search
  CPC ........... H01L 21/3065; H01L 21/31116; H01L 2924/002; H01L 2223/54486; H01L 22/00; H01L 22/10; H01L 23/544; G02F 1/1303
  USPC .................................. 216/41, 43, 45, 48, 49
  See application file for complete search history.

(56) References Cited

U.S. PATENT DOCUMENTS

| | | | | |
|---|---|---|---|---|
| 7,100,826 | B1* | 9/2006 | Phan ................... | G06Q 10/087 235/385 |
| 2003/0003608 | A1* | 1/2003 | Arikado ............... | H01L 23/544 438/14 |
| 2006/0131696 | A1* | 6/2006 | Arikado ............... | H01L 23/544 257/618 |
| 2006/0269851 | A1* | 11/2006 | Frisa ................... | G03F 7/70541 430/5 |
| 2006/0279879 | A1* | 12/2006 | Hirooka ............... | G11B 5/3103 360/131 |
| 2009/0057837 | A1* | 3/2009 | Marshall ........... | H01L 21/02005 257/618 |
| 2010/0124610 | A1* | 5/2010 | Aikawa ............... | C23C 16/4584 427/255.28 |
| 2012/0207981 | A1 | 8/2012 | Habuta et al. | |
| 2012/0243111 | A1* | 9/2012 | Iijima ................ | G02B 13/0085 359/811 |
| 2013/0193560 | A1* | 8/2013 | Usui .................... | G03F 9/7007 257/618 |

FOREIGN PATENT DOCUMENTS

| | | |
|---|---|---|
| CN | 103354770 A | 10/2013 |
| CN | 103477433 A | 12/2013 |
| WO | 2011024945 A1 | 3/2011 |

OTHER PUBLICATIONS

International Search Report mailed Oct. 31, 2014; PCT/CN2014/078707.
Written Opinion of the International Searching Authority mailed Oct. 31, 2014; PCT/CN2014/078707.
Second Chinese Office Action dated Jun. 17, 2016; Appln. No. 201410041060.8.

* cited by examiner

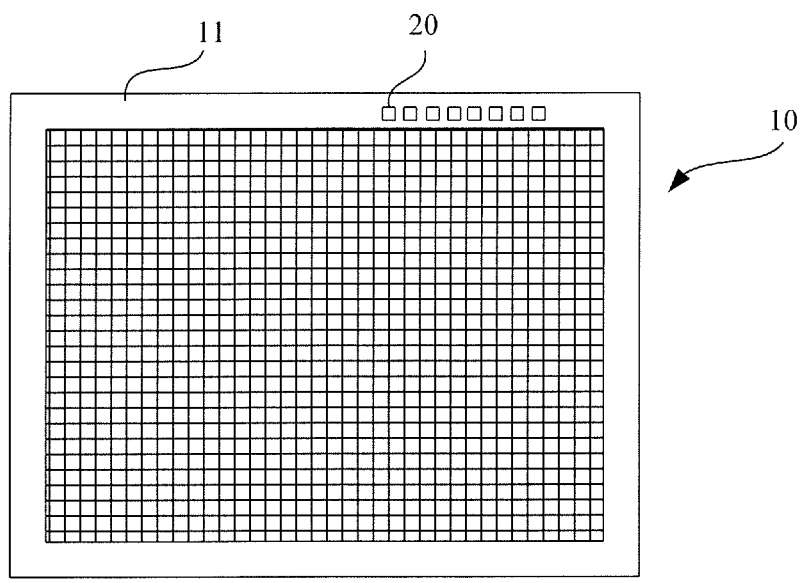

PRODUCTION METHOD OF DISPLAY SUBSTRATE, PRODUCTION CONTROL SYSTEM AND PRODUCTION APPARATUS

TECHNICAL FIELD

Embodiments of the disclosure relate to a production method of a display substrate, a production control system and a production apparatus.

BACKGROUND

In a production process of a liquid crystal display, the production procedures are generally carried out in an established order under the control of a computer production control system. The order of production procedures for a display substrate of a thin-film transistor liquid crystal display in a Twisted Nematic (TN) mode is different from the order of production procedures for the display substrate of the thin-film transistor liquid crystal display in an Advanced Super Dimension Switch (ADS) mode. With a color filter substrate of the liquid crystal display in the ADS mode as an example, the production procedures of the color filter substrate includes: a procedure for forming a transparent conductive layer, a procedure for forming a black matrix, a procedure for forming a color filter layer, a procedure for forming a spacer, etc. In the production process of the display substrate, the computer production control system controls the substrate to sequentially undergo respective predetermined procedures.

However, if failures of the computer production control system or other reasons (such as operator's misoperation) cause loss or disorder of the information stored in the computer production control system, it is impossible to determine the status of the substrate.

SUMMARY

According to embodiments of the present disclosure, there is provided a production method of a display substrate. The method comprises: in a process for producing the display substrate by a plurality of procedures, forming marks for recording procedure progress information on the display substrate.

For example, the marks form a progress bar, and current length and/or pattern of the progress bar indicates current procedure progress information; or, the marks form a three-dimensional laminated structure, and current pattern and/or material of the three-dimensional laminated structure indicates the current procedure progress information.

For example, the procedure progress information includes at least one of: current information on the procedures that have been completed, current information on the procedure to be performed, and current information on the procedures that failed or are missed.

For example, the production method of the display substrate further comprises: detecting the marks before at least one procedure starts to be executed, and determining to start the procedure or to suspend the procedure and alarm according to a detection result.

For example, the production method of the display substrate further comprises: detecting the marks after at least one procedure is executed, and determining whether to suspend the procedure and alarm according to a detection result.

For example, the plurality of procedures include one or more of: coating, depositing by thermal evaporation, magnetron sputtering, exposing, developing, etching, cleaning, drying, cutting, and deducting.

For example, the plurality of procedures includes: coating, depositing by thermal evaporation, magnetron sputtering, exposing, developing, and etching; and at least a portion of the mark is formed by using the procedure corresponding to the mark.

For example, the marks are formed on a side edge of the display substrate, and the side edge is located outside a display region of the display substrate.

For example, the alarm includes an audible alarm and/or a light alarm.

According to embodiments of the present disclosure, there is provided a production control system of a display substrate. The production control system comprises: a processing module, for sending out a control signal for forming marks on the substrate when the substrate proceeds to production procedures.

For example, the production control system of the display substrate further comprises: an acquisition module for acquiring information on the marks formed on the substrate, wherein the processing module is in signal connection with the acquisition module to determine whether the marks are qualified; if the marks are unqualified, the processing module sends out an alarm control; and an alarm module, in signal connection with the processing module and sending out an alarm upon receiving the alarm control.

According to embodiments of the present disclosure, there is provided a production apparatus of a display substrate. The production apparatus comprises: a mark forming device, including a coating device for coating a material on the substrate in each procedure and a patterning device corresponding to the coating device and configured for patterning the material coated on the substrate to form the mark; and a control device, in signal connection with the mark forming device and configured for controlling the mark forming device to form the marks on the substrate when the substrate proceeds to the production procedures.

For example, the production apparatus of the display substrate further comprises: a detecting device, configured for detecting the marks formed on the substrate. The control device is in signal connection with the detecting device; when the substrate proceeds to the procedures except a first procedure, the control device controls the detecting device to detect the marks formed on the substrate and determines whether the marks are qualified or not, and if the marks are unqualified, the control device sends out the alarm.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1 is a finished display substrate according to embodiments of the present disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In order to facilitate the supervision of the status of a display substrate during a production process of the display substrate, the embodiments of the present disclosure provide a production method of the display substrate, a production control system and a production apparatus. In the embodiments of the present disclosure, a mark is formed on the substrate in each procedure. By using such mark, the status of the substrate is recorded, so that the supervision of the status of the display substrate is facilitated.

The embodiments of the present disclosure provide the production method of the display substrate, the method comprises: in a process for producing the display substrate by a plurality of procedures, forming marks for recording procedure progress information on the display substrate.

For example, each mark corresponds to one procedure.

In the production method as described above, the marks for recording procedure progress information of the substrate are formed in the production process of the substrate, so as to facilitate the supervision of the status of the substrate. Since each mark corresponds to one procedure, the current status of the substrate is capable of being determined by observing the formed marks. If failures (for example, certain procedure is missed) occur, such failures are capable of being easily found out by directly observing the marks formed on the substrate. Thus, check of the substrate is facilitated, and the supervision of the status of the substrate is facilitated.

For example, the plurality of procedures include one or more of: coating, depositing by thermal evaporation, magnetron sputtering, exposing, developing, etching, cleaning, drying, cutting, dedusting and the like. During processing the substrate, the above procedures may be performed in different orders and other procedures may be included.

For example, the plurality of procedures includes: coating, depositing by thermal evaporation, magnetron sputtering, exposing, developing, and etching. In this case, at least a portion of the mark is formed by using the procedure corresponding to the mark. In other words, the mark is formed in the corresponding procedure.

For example, the marks form a progress bar, and the current length and/or pattern of the progress bar indicates the current procedure progress information. For example, the marks form a three-dimensional laminated structure, and the current pattern and/or material of the three-dimensional laminated structure indicates the current procedure progress information. Of course, except for the progress bar and the three-dimensional laminated structure as described above, the procedure progress information of the substrate may be recorded by marks of other structures, which will not be limited by the embodiment of the present disclosure. For example, in the case that the marks form the progress bar, the segments of the progress bar are arranged in an order same to that of the procedures for producing the substrate and the segments of the progress bar corresponding to the respective procedures have a same length, so that the status of the substrate is determined by observing the current length of the progress bar and the current number of the segments of the progress bar. For example, in the case that the marks form the progress bar, the segments of the progress bar employ different patterns or different lengths to indicate different procedures, which may be designed according to the practical requirements. For example, in the case that the marks form the three-dimensional laminated structure, the respective procedures form the corresponding marks at a same position on the substrate, and the formed marks are laminated sequentially. For example, in the case that the marks form the three-dimensional laminated structure, the marks formed in respective procedures have different patterns; for example, the marks formed from a first procedure to a last procedure become smaller and smaller, so that the information on the number of procedures that the substrate has completed is obtained by directly observing the number of the laminated marks. For example, in the case that the marks form the three-dimensional laminated structure, the marks formed in respective procedures have other patterns, and the information on the number of procedures that the substrate has completed is obtained by measuring a light transmittance of the formed marks that are laminated sequentially.

For example, the procedure progress information includes at least one of: current information on the procedures that have been completed, current information on the procedure to be performed, and current information on the procedures that failed or are missed. The formed marks convey many kinds of information. By forming each mark with different patterns on the substrate, the formed mark covey different information. For example, when the procedure goes well, the mark formed in the procedure is formed to have a pattern with a round hole. For example, when there was a failure in the procedure or the apparatus has alarmed in the procedure, the mark formed in the procedure is formed to have a pattern with a square hole. Alternatively, when there was a failure in the procedure or the apparatus has alarmed in the procedure, the mark formed in the procedure is formed to have the pattern with the round hole but a thickness of the mark is lower than a thickness of the mark formed in the normal procedure. Based on the formed mark, it can be determined whether there was a failure in the procedure or not. In the case there is a detecting device, the pattern of the mark formed on the substrate is detected by the detecting device, so as to perform the in-situ supervision of the status of the substrate.

For example, the production method further comprises: detecting the marks before at least one procedure starts to be executed.

According to the detection result, it is determined to start the procedure or it is determined to suspend the procedure and alarm. By detecting the marks on the substrate, a case that the procedure is missed is avoided, so that the production efficiency of the display substrate is improved.

By detecting the marks formed on the substrate, the status of the substrate is supervised and the alarm is sent out when a procedure is missed, which avoids the case that the procedure is missed and improves the production efficiency of the display substrate.

For example, the production method further comprises: detecting the marks after at least one procedure is executed.

According to the detection result, it is determined whether to suspend the procedure and alarm or not. By detecting the marks on the substrate, the case that the procedure is missed is avoided, so that the production efficiency of the display substrate is improved.

For example, the display substrate is an array substrate or an opposite substrate of a liquid crystal display, an array substrate or an opposite substrate of an OLED display, or a display substrate of a display of any other type, which will not be limited by the embodiments of the present disclosure.

Hereinafter, the method provided by the embodiments of the present disclosure will be described in detail with reference to the accompanying drawings.

As show in FIG. 1, the marks 20 as described above are formed on a side edge 11 of the display substrate 10, the side edge 11 is located outside a display region of the display substrate and is an edge of the substrate 10 which is unnecessary to be processed to form other patterns than the marks; and the marks 20 are formed in the respective procedures for producing the substrate 10. For example, each of the marks 20 is formed as follows: after the substrate 10 is coated in the corresponding procedure, the mark 20 is formed with a predetermined pattern on the side edge 11 of the substrate 10 by a patterning process. In the production process of the display substrate 10, when the substrate 10 proceeds to the procedure to form a desired pattern by coating and patterning processes, the mark 20 is simultaneously formed on the side edge 11 of the substrate 10; that is, when the mark 20 is formed on the substrate 10, the corresponding procedure of the substrate 10 is completed. For example, the marks 20 formed on the substrate 10 are arranged in the order same to the order of the procedures for producing the substrate 10, to facilitate the detection of the marks 20. In the above-described method, when the mark 20 is not detected, an alarm is sent out; the alarm includes an audible alarm and/or a light alarm, and different types of alarms may be selected according to practical requirements.

Hereinafter, with the opposite substrate of the liquid crystal display in the ADS mode as an example, the above-described production method of the display substrate will be described in detail. For example, the opposite substrate of the liquid crystal display in the ADS mode sequentially undergoes the procedures of: a procedure for forming a transparent conductive layer, a procedure for forming a black matrix, a procedure for repairing the black matrix, a procedure for forming a color filter layer, a procedure for repairing the color filter layer, a procedure for forming a protective layer, a procedure for forming a spacer, and a procedure for repairing the spacer. For example, before each procedure, the detection of the mark formed in the previous procedure is performed. For example, the display substrate is fabricated by the following steps.

Step 001: providing the substrate;

Step 002: forming the transparent conductive layer on the substrate, and forming the corresponding mark on the side edge of the substrate;

Step 003: forming the black matrix on the substrate, and forming the corresponding mark on the side edge of the substrate;

Step 004: repairing the transparent conductive layer and the black matrix formed on the substrate, and forming the corresponding mark on the side edge of the substrate;

Step 005: forming the color filter layer on the substrate, and forming the corresponding mark on the side edge of the substrate;

For example, when the color filter layer is formed on the substrate, color filters of red, green and blue are sequentially formed; and during forming each of the color filters of red, green and blue, the corresponding mark is formed on the side edge of the substrate;

Step 006: repairing the color filter layer formed on the substrate, and forming the corresponding mark on the side edge of the substrate;

Step 007: forming the protective layer on the substrate, and forming the corresponding mark on the side edge of the substrate;

Step 008: forming the spacer on the substrate, and forming the corresponding mark on the side edge of the substrate;

Step 009: repairing the spacer formed on the substrate, to complete the production of the display substrate.

It can be seen from the above-described steps that, the status of the substrate can be determined by observing the formed marks and the procedure progress information of the substrate can be determined, which facilitates the supervision of the processing status of the substrate.

Further, in addition to the above-described steps, the production method for example further comprises: after each procedure is completed or before each procedure starts to be performed, the detection of the marks formed on the substrate is performed. If the detected marks are qualified, the substrate continues to be processed; if the detected marks are unqualified, the alarm is sent out.

It should be noted that, in the embodiments of the present disclosure, the times, the order and the position for the step of detecting the mark will not be limited during the process for producing the substrate. For example, according to the practical requirements, it is determined whether the mark is detected or not, it is determined after or before which procedure(s) the detection is performed, and it is determined whether to send out the alarm or just indicate to suspend the procedure without the alarm, etc.

Through the descriptions of the above steps, it can be seen that in the production method of the display substrate provided by the embodiments of the present disclosure, the supervision of the processing status of the substrate can be implemented by detecting the marks, which avoids the case that the procedure is missed, enhances the quality of the produced display substrate and improves the production efficiency of the display substrate.

In addition, the following problem is apt to occur in the production method of the opposite substrate according to a comparative example: defects of the black matrix having been repaired are repaired again in the posterior procedures for repairing the color filter layer and the spacer. However, in the production method provided by the embodiments of the disclosure, the repeated repairing is avoided for the above-described steps are supervised, and accordingly waste is avoided.

It should be noted that, the order of the procedures in the production process of the display substrate in the TN mode is different from the order of the procedures in the production process of the display substrate in the ADS mode; however, the formation and detection of the marks in the production process of the display substrate in the TN mode are similar to those in the production process of the display substrate in the ADS mode, which will not be repeated here.

Embodiments of the present disclosure further provide a production control system of a display substrate, the production control system comprises: a processing module, for sending out a control signal for forming marks on the substrate when the substrate proceeds to production procedures.

In the above-described production control system, the marks are formed on the substrate under the control of the processing module.

For example, the production control system further comprises: an acquisition module for acquiring the information on the marks formed on the substrate, wherein the processing module is in signal connection with the acquisition module to determine whether the marks are qualified; if the marks are unqualified (for example, the desired mark is not formed), the processing module sends out an alarm control; and an alarm module, in signal connection with the processing module and sending out an alarm upon receiving the alarm control.

In the above-described production control system, the information on the marks formed on the substrate is acquired by the acquisition module of the production control system and is sent to the processing module; when the processing module determines that the mark is unqualified (for example, the desired mark is not formed), the alarm module sends out the alarm. Thus, the case that the procedure is missed is avoided, and the production efficiency of the display substrate is improved.

For example, the alarm module is an audible alarm device and/or a light alarm device.

Embodiments of the present disclosure further provide a production apparatus of a display substrate. The production apparatus comprises: a mark forming device, including a coating device for coating a material on the substrate in each procedure and a patterning device corresponding to the coating device and configured for patterning the material coated on the substrate to form the mark; and a control device, in signal connection with the mark forming device and configured for controlling the mark forming device to form the marks on the substrate when the substrate proceeds to the production procedures.

In the above-described production apparatus, the marks for recording the procedure progress information of the substrate is formed in the production process of the substrate, so as to facilitate the supervision of the processing status of the substrate. At the same time, the control device controls the mark forming device to form the marks for recording the substrate information on the substrate.

For example, the production apparatus further comprises: a detecting device, configured for detecting the marks formed on the substrate;

The control device is in signal connection with the detecting device. When the substrate proceeds to the procedures except the first procedure, the control device controls the detecting device to detect the marks formed on the substrate and determines whether the marks are qualified or not, and if the marks are unqualified (for example, the desired mark is not formed), the control device sends out the alarm.

In the above-described production apparatus, the coating device is the coating device for coating the material on the substrate in each procedure. In the production apparatus provided by the embodiments of the present disclosure, by detecting the marks formed on the substrate in each procedure and sending out the alarm if the mark is unqualified (for example, the desired mark is not formed), the case that the procedure is missed is avoided, the quality of the produced display substrate is enhanced and the production efficiency of the display substrate is improved.

The foregoing embodiments merely are exemplary embodiments of the disclosure, and not intended to define the scope of the disclosure, and the scope of the disclosure is determined by the appended claims.

The present application claims priority of Chinese Patent Application No. 201410041060.8 filed on Jan. 27, 2014, the disclosure of which is incorporated herein by reference in its entirety as part of the present application.

What is claimed is:

1. A production method of a display substrate, comprising:
   in a process for producing the display substrate by a plurality of procedures, forming marks for recording procedure progress information on the display substrate,
   wherein one of the marks is formed in each of the plurality of procedures,
   wherein the plurality of procedures include one or more of: coating, depositing by thermal evaporation, magnetron sputtering, exposing, developing, etching, cleaning, drying, cutting, and dedusting, and
   wherein at least a portion of the marks is formed by using the procedure corresponding to the mark.

2. The production method of the display substrate according to claim 1, wherein
   the marks form a progress bar, and current length and/or pattern of the progress bar indicates current procedure progress information; or,
   the marks form a three-dimensional laminated structure, and current pattern and/or material of the three-dimensional laminated structure indicates the current procedure progress information.

3. The production method of the display substrate according to claim 1, wherein
   the procedure progress information includes at least one of: current information on the procedures that have been completed, current information on the procedure to be performed, and current information on the procedures that failed or are missed.

4. The production method of the display substrate according to claim 1, further comprising:
   detecting the marks before at least one procedure starts to be executed, and determining to start the procedure or to suspend the procedure and start an alarm according to a detection result.

5. The production method of the display substrate according to claim 1, wherein
   the marks are formed on a side edge of the display substrate, and the side edge is located outside a display region of the display substrate.

6. The production method of the display substrate according to claim 4, wherein the alarm includes an audible alarm and/or a light alarm.

7. The production method of the display substrate according to claim 1, further comprising:
   detecting the marks after at least one procedure is executed, and determining whether to suspend the procedure and start an alarm according to a detection result.

8. The production method of the display substrate according to claim 7, wherein the alarm includes an audible alarm and/or a light alarm.

9. A production control system of a display substrate, comprising:
   a processing module, for sending out a control signal for forming marks on the substrate in the case that the substrate proceeds to a plurality of production procedures,
   wherein in response to the control signal of the processing module, one of the marks is formed in each of the plurality of procedures,
   wherein the plurality of procedures include one or more of: coating, depositing by thermal evaporation, magnetron sputtering, exposing, developing, etching, cleaning, drying, cutting, and dedusting, and
   wherein in response to the control signal of the processing module, at least a portion of the marks is formed by using the procedure corresponding to the mark.

10. The production control system of the display substrate according to claim 9, further comprising:
    an acquisition module for acquiring information on the marks formed on the substrate, wherein the processing module receives the information acquired by the acquisition module to determine whether the marks are formed; in the case that the marks are not formed, the processing module sends out an alarm control; and an alarm module, receiving the alarm control from the processing module and sending out an alarm upon receiving the alarm control.

11. A production apparatus of a display substrate, comprising:
a mark forming device, including a coating device for coating a material on the substrate in each procedure and a patterning device corresponding to the coating device and configured for patterning the material coated on the substrate to form the mark; and
a control device, configured for controlling the mark forming device to form the marks on the substrate in the case that the substrate proceeds to a plurality of production procedures,
wherein one of the marks is formed in each of the plurality of procedures,
wherein the plurality of procedures include one or more of: coating, depositing by thermal evaporation, magnetron sputtering, exposing, developing, etching, cleaning, drying cutting, and dedusting, and
wherein at least a portion of the marks is formed by using the procedure corresponding to the mark.

12. The production apparatus of the display substrate according to claim 11, further comprising: a detecting device, configured for detecting the marks formed on the substrate;
wherein in the case that the substrate proceeds to the procedures except a first procedure, the control device controls the detecting device to detect the marks formed on the substrate and determines whether the marks are formed or not, and in the case that the marks are not formed, the control device sends out the alarm.

* * * * *